United States Patent [19]

Shepherd et al.

[11] Patent Number: 4,994,768
[45] Date of Patent: Feb. 19, 1991

[54] FREQUENCY SYNTHESIZER WITH FM MODULATION

[75] Inventors: Wayne P. Shepherd; Darrell E. Davis, both of Sunrise; Frederick L. Martin, Gainesville, all of Fla.

[73] Assignee: Motorola, Inc., Schaumburg, Ill.

[21] Appl. No.: 499,102

[22] Filed: Mar. 26, 1990

Related U.S. Application Data

[63] Continuation-in-part of Ser. No. 328,834, Mar. 27, 1989, abandoned.

[51] Int. Cl.$^5$ .............................................. H03C 3/09
[52] U.S. Cl. .................................... 332/127; 455/113; 455/119
[58] Field of Search ............... 332/100, 101, 102, 103, 332/104, 105, 127, 128, 144, 145, 146, 147, 148; 455/42, 76, 110, 113, 119

[56] References Cited

U.S. PATENT DOCUMENTS

| | | | |
|---|---|---|---|
| 4,068,199 | 1/1978 | Madoff | 331/25 X |
| 4,481,489 | 11/1984 | Kurby | 332/19 |
| 4,543,542 | 9/1985 | Owen | 332/18 |
| 4,546,331 | 10/1985 | Da Silva et al. | 332/19 |
| 4,562,414 | 12/1985 | Linder et al. | 332/9 R |
| 4,573,026 | 2/1986 | Curtis et al. | 332/18 |
| 4,609,881 | 9/1986 | Wells | 331/1 A |
| 4,686,488 | 8/1987 | Attenborough | 331/2 |
| 4,810,977 | 3/1989 | Flugstad et al. | 332/19 |

*Primary Examiner*—Siegfried H. Grimm
*Attorney, Agent, or Firm*—Juliana Agon

[57] ABSTRACT

A frequency synthesizer (10) for providing a modulated output signal (fo) includes a reference frequency signal (fr) and a voltage controlled oscillator (14). For dividing the frequency of the output signal from the voltage controlled oscillator (14) by a divisor, a programmable divider (16) is coupled to the output of the voltage controlled oscillator (14). To produce a phase-locked loop in which the frequency of the output signal from the voltage controlled oscillator (14) is equal to the frequency of the reference frequency (fr) signal multiplied by the divisor, a phase detector (12) having a first input coupled to the reference frequency signal (fr), a second input coupled to the output of the programmable divider (16), and an output coupled to the input of the voltage controlled oscillator (14) is also provided. A first integrator (24) for integrating a modulating signal provides an integrated signal and a first control signal. Similarly, a second integrator (25) coupled to the first integrator (24) for integrating the integrated signal provides a second control signal. A differentiator (36, 42 and 48) coupled to the second integrator (25) differentiates the second control signal to provide a third control signal. Finally, a processor (41 and 43) coupled to the first integrator (24), the second integrator (25) and the differentiator (36, 42 and 48) processes the first, second, and third control signals and a divider modulus code (M). The processor (41 and 43) coupled to the programmable divider modifies the divider modulus code (M) in response to the modulating signal (9) to provide the divisor, whereby the frequency of the output signal from the voltage controlled oscillator (14) is modulated by the modulating signal (9).

22 Claims, 6 Drawing Sheets

FREQUENCY SYNTHESIZER WITH FM MODULATION

This is a continuation-in-part of application No. 7/328,834 filed Mar. 27, 1989 and now abandoned.

BACKGROUND OF THE INVENTION

This invention relates generally to frequency synthesizers, and more particularly to modulation of a frequency synthesizer.

Frequency divider circuits are used in frequency synthesizers, and more particularly to modulation of a frequency synthesizer.

Frequency divider circuits are used in frequency synthesizer circuits such as in phase locked loop (PLL). IN a PLL circuit, the output frequency (fo) of a voltage controlled oscillator (VCO) is divided (56') and applied to a phase detector. The phase detector operates to compare the phase of the divided output signal with a reference frequency ($f_r$) from a reference oscillator in order to control the VCO output frequency. The output frequency (fo) is related to the reference frequency of the reference oscillator by the relationship fo $= M \times f_r$, where M is a divider modulus code which determines the extent that the output frequency is divided before it is compared with the reference frequency. As is known, M may be produced by a signal processor.

One direction in frequency synthesizer design is towards improving the performance of PLL frequency synthesizers by widening the loop bandwidth. A wider loop bandwidth improves transient response and reduces noise better than a narrow loop bandwidth. However, a wider loop bandwidth requires a higher reference frequency with a resultant lower divider modulus (M). As the modulus is decreased, the phase excursion required at a phase modulator (which is typically coupled to one input of the phase detector) for conventional frequency modulation may increase beyond a limit (i.e., the modulator's linear operating range of II radians). This problem is intensified with low frequency modulating signals, which require an even greater phase excursion. Therefore, a need exists to increase the maximum amount of phase excursion to facilitate modulation via a low frequency modulating signal in a PLL having a high reference frequency.

SUMMARY OF THE INVENTION

It is an object of the present invention to provide a frequency synthesizer with FM modulation, which operates to vary a divider modulus code as a function of the modulating signal.

Briefly, according to the invention, the synthesizer includes an accumulator for integrating a modulating signal to provide a integrated signal and a first control signal. The integrated signal is coupled to another accumulator for further integration to provide a second control signal. A third control signal results from differentiating the second control signal. Processing the first, second, and third control signals and a divider modulus code, a signal process modified the divider modulus code in response to the modulating signal.

According to another aspect of the invention, a frequency synthesizer in a radio for providing a modulated output signal, comprises a phase-locked loop including a reference frequency signal source, a phase detector, a voltage controlled oscillator, and a programmable divider operatively connected to apply a divisor to either the output of the voltage controlled oscillator or the output of the reference frequency signal source. A first integrator for integrating a modulating signal provides an integrated signal and a first control signal. Similarly, a second integrator coupled to the first integrator for integrating the integrated signal provides a second control signal. A differentiator coupled to the first integrator differentiates the second control signal to provide a third control signal. Finally, a processor coupled to the first integrator, the second integrator and the differentiator processes the first, second, and third control signals and a divider modulus code. The processor coupled to the programmable divider modifies the divider modulus code in response to the modulating signal to provide the divisor, whereby the frequency of the output signal from the voltage controlled oscillator is modulating by the modulating signal.

DESCRIPTION OF THE PREFERRED EMBODIMENT

Figure 1:
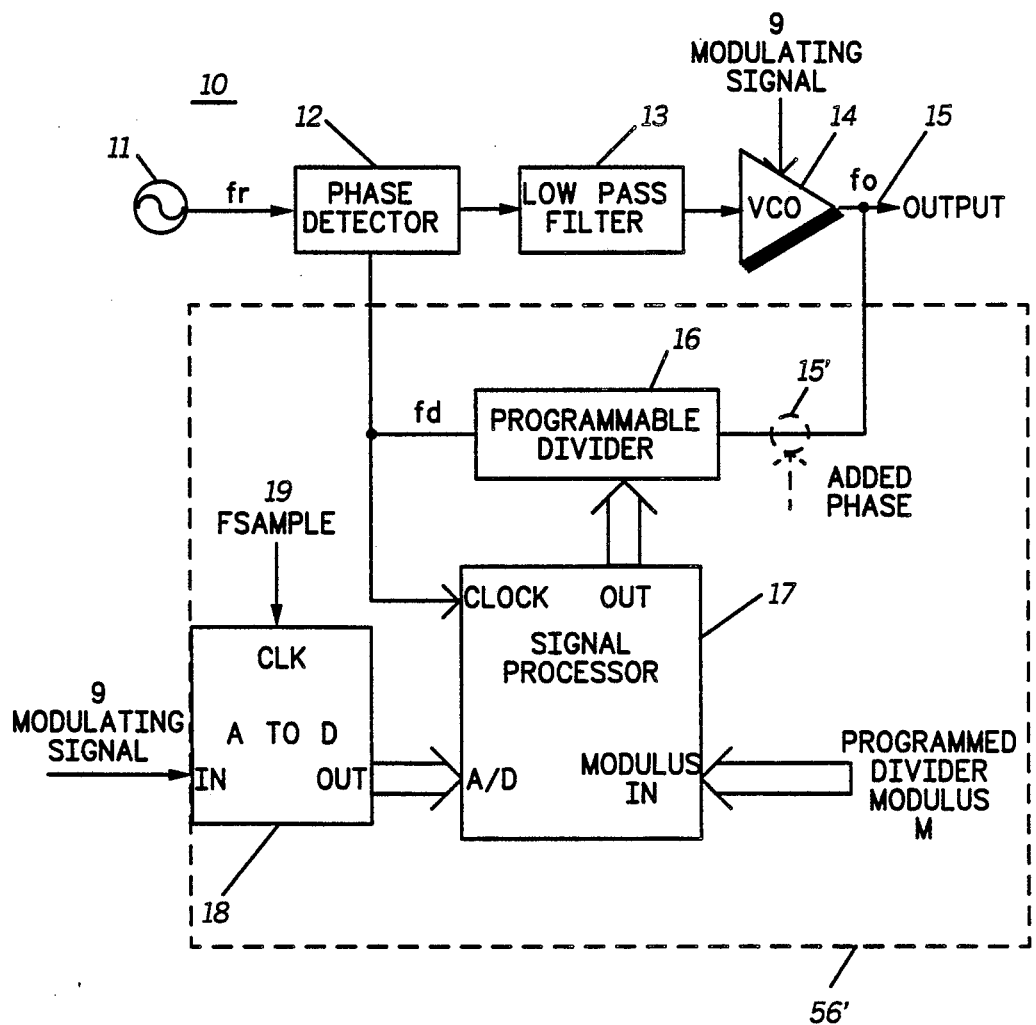
FIG. 1 is a block diagram of a preferred embodiment of a frequency synthesizer with FM modulation in accordance with the present invention.

Referring to FIG. 1, it will be understood that a frequency synthesizer 10, in accordance with the present invention, includes a reference oscillator 11. The output of reference oscillator 11 ($f_r$) is applied to a phase detector 12 that has its output coupled, via a low pass filter 13, to a voltage controlled oscillator (VCO) 14. Optionally, a fixed reference divider (not shown) may divide the oscillator output frequency by a reference divisor to provide the reference frequency ($f_r$). As a second input, the VCO 14 receives a modulating signal 9 that directly modulates the VCO using known dual port modulation techniques. The output (fo) whether modulated or unmodulated) of the VCO 14 is connected to an output port 15 of the frequency synthesizer 10, and to a programmable divider 16. The output of divider 16 provides a divided signal ($f_d$) to the phase detector 12 and to a signal processor 17. The signal processor 17 is connected to the programmable divider 16 and provides the divider modulus code that reduces fo to fd.

Two inputs are provided to the signal processor 17. One input is for the divider modulus code and the other input is for an A/D converter 18. The A/D converter 18, having an input for the modulating signal is clocked in by a sampling signal (Fsample) 19. The signal processor 17 processes a divider modulus (M) and the output of the A/D converter 18 to modify M in accordance with the modulating signal 9 to achieve analog modulation with digital methods.

Figure 2:
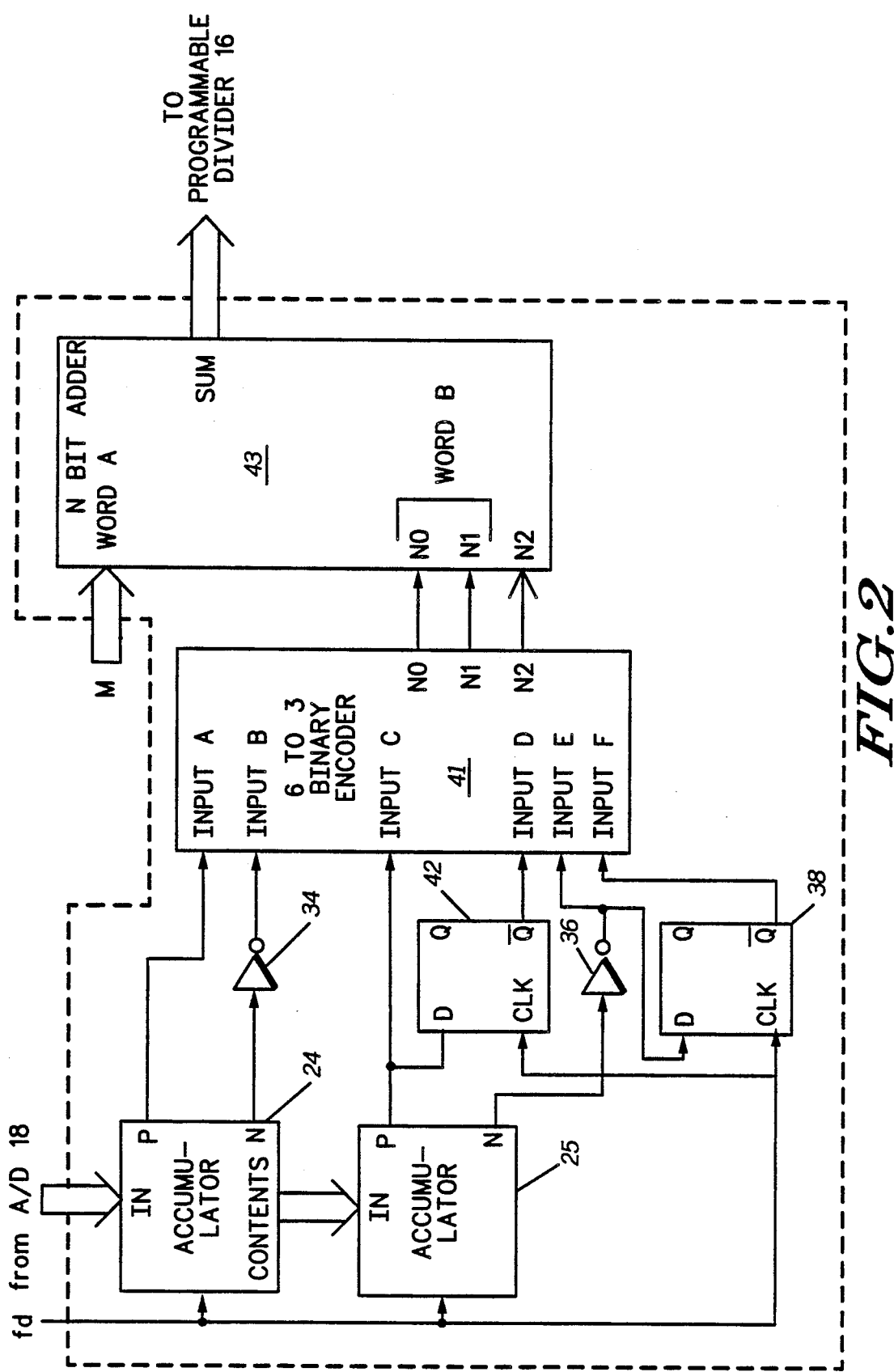
FIG. 2 is a block diagram of the signal processor of the frequency synthesizer of FIG. 1.

Referring to FIG. 2, the output (A/D word) of the A/D converter 18 is connected to the nut of a first accumulator 24, which comprises means for integrating a modulating signal. One output of the first accumulator (contents) is connected to the input of a second accumulator 25, which comprises means for integrating the integrated signal. In this manner, the outputs of the accumulators depend on the A/D word. Preferably, each of the accumulators 24 and 25 may have the same capacity; however, the two accumulators need not have the same resolution. Resolution is the smallest step size by which the accumulator increments before reaching capacity when the contents overflow to generate a carry. Positive and negative carry outputs of the accumulator 24 comprise a first control signal. Likewise, a positive and a negative output of the accumulator 25 comprise a second control signal. The positive carry (P) output of the accumulator 24 is fed to an input (A) of a 6-to-3 binary encoder 41. Similarly, after inversion by Motorola inverter type 74LS04 (34), the negative carry output (N) is fed to another input (B) of the encoder 41. A positive carry output of the second accumulator 25 is fed to another input (C) of the binary encoder 41, and to a (D) input of a flip-flop 42. Coupled to an input (D) of the binary encoder 41 is the Q BAR output of the flip-flop 42. After inversion (36), the negative carry output of the accumulator 25 is coupled into the input (E) of the binary encoder 41, and to a (D) input of another flip-flop 38. Coupled to a last input (F) of a binary encoder 41, is the Q BAR output of flip-flop 38. Motorola type 74LS04 inverter (36) and 74LS74 flip-flops (38 and 42) may be used as differentiating means. The delaying and inverting operation of the flip-flops (38 and 42) produces a differentiating effect by decreasing (or increasing) the divider modulus code after the modulus has been previously increased (or decreased) due to the positive (or negative) carry. In this successive approximation method, the output pulse created in the divider simulates the instantaneous differential impulse created each time the accumulator 25 overflows. Thus, the resolution of the two accumulators (24 and 25) operating with the analog-to-digital converter provide the fine resolution needed to achieve linear modulation with digital techniques.

Clock inputs of flip-flops 38 and 42 and accumulators 24 and 25 are coupled to the output of the programmable divider 16 ($f_3$). Alternatively, these clock signals could be provided directly by the reference oscillator 11 since $f_d$ and $f_r$ are phase locked. Alternately, even if the signals were not phase locked, the normally small variation between the signals will render either signal usable.

After translation by the 6-to-3 encoder 41, the three outputs, $N_0$, $N_1$, and $N_2$ are applied to an adder 43 as a word B input. The modulus (M), (word A input), is summed to the word B to derive the divisor of the programmable divider 16.

Figure 3A:
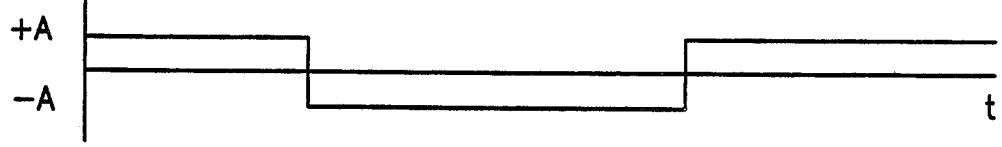
FIG. 3A-3I are illustrations of signal wave forms at various points of the signal processor of FIG. 2.

Referring to FIGS. 3A-3I, the operation of the present invention will be described. While the circuit will respond to any waveform within the resolution of the A/D converter 18, the example of a square wave modulating signal with amplitude A will be considered. A representation of this waveform is shown in FIG. 3A. It is assumed that the waveform in FIG. 3A is periodic with the fundamental frequency of the waveform much less than the unity gain frequency of the loop.

Figure 3B:
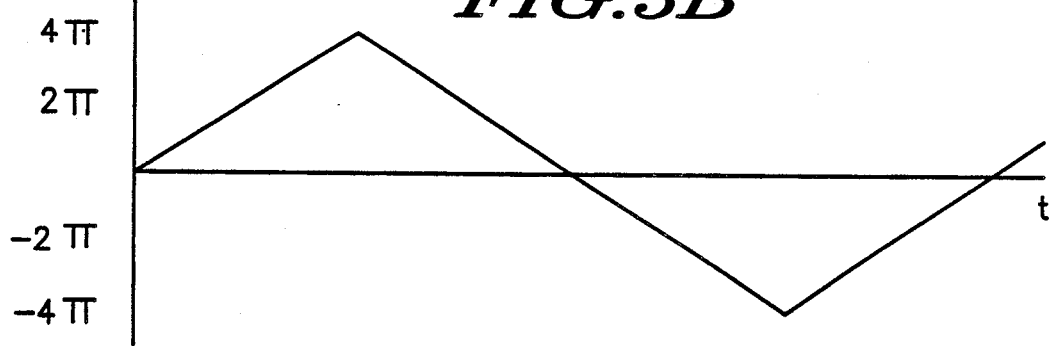

FIG. 3B shows the phase adjustments required from steady state on the VCO output signal fo to produce the desired FM modulating signal. Note that this waveform is proportional to the integral of the modulating signal waveform shown in FIG. 3A. The phase adjustments to the steady state VCO output signal are significant because the invention functions by applying or inducing phase adjustments to the loop by varying the transient time and magnitude of the divider modulus.

For each pulse the (fd) signal, the first accumulator 24 sums the input from the A/D converter 18 to the value already stored in accumulator 24. Because the output of the A/D converter 18 is proportional to the amplitude of the modulating signal, and because the repeated summing of a signal to itself at fixed intervals can be regarded as integration, the contents of accumulator 24 can be treated as the integral fo the modulating signal. In the invention, accumulator 24 is scaled such that its capacity is equivalent to $2\pi$ radians change in phase from steady state of the VCO output signal fo. In this way, the relationship between the amplitude of the modulating signal and the frequency deviation of the FM modulated signal is established.

Figure 3C:

Each time the accumulator 24 reaches its capacity a carry is generated. The carry has the effect of increasing the divisor of the programmable divider 16 for one cycle of the divider output fd. For the example modulating waveform shown in FIG. 3A, the change in divider modulus as a result of the action of first accumulator 24 is shown in FIG. 3C. Since the first accumulator 24 generates both positive and negative carry signals, and since the negative carry signal is inverted by inverter 34, the divisor can be either increased or decreased from its steady state value.

Figure 3D:
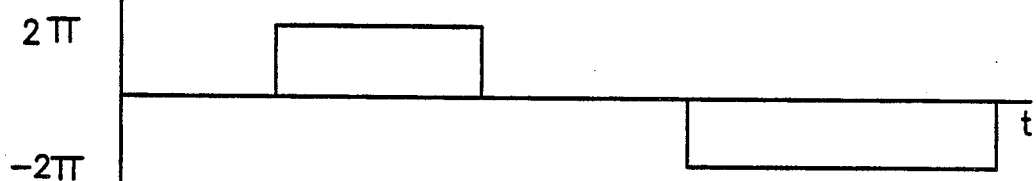

FIG. D shows the phase adjustments to the loop due to the action of the first accumulator 24. Although the waveform cannot be measured directly in the circuit, in a signal flow notation it would be summed as an input (15') before the input to the divider but after the output branch of signal fo. As FIG. 3D illustrates, the first accumulator causes large step changes in the phase of the signal at the divider input (15'). Additional refinement of the signal is required to reduce distortion at the synthesizer output.

The second accumulator 25 along with flip flops 38 and 42 act to reduce the distortion on the FM modulated signal as described below. For each pulse of fd, the second accumulator input sums the contents of the first accumulator 24 to the contents of the accumulator 25. The contents of the accumulator 25 can be considered to be the integral of the quantity in the contents of the accumulator 24. The capacity of accumulator 25 is typically identical to that of accumulator 24. Though the actions of the positive carry output of the second accumulator 25 and flip flop 42, each positive carry on the accumulator 25 causes the divider modulus code of the loop divider 16 to increase by one from its steady state value for one cycle of $f_d$ and decrease by one from its steady state value on the subsequent cycle. Similarly, a negative carry induces a decrease in the divider modulus code followed by an increase for the subsequent cycle. This action can be treated as summing to the loop via the loop divider the derivative of the contents in the second accumulator, which is equivalent to the value in the first accumulator. Since actions precipitated by second accumulator carries are always implemented in pairs (an increase coupled to a decrease in the divisor) there is no net change in the average value of the divisor due to the action of the second accumulator 25. However, the amount of phase adjustments summed to the loop is not zero, but tracks the magnitude of the phase adjustment required by the modulating signal.

Figure 3E:
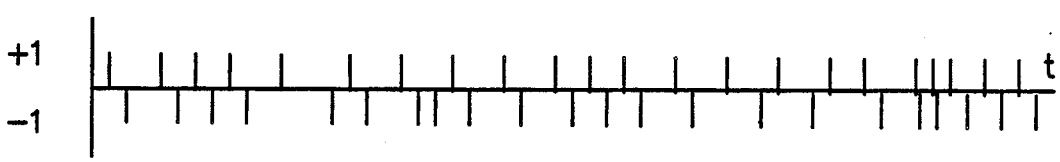
Figure 3F:
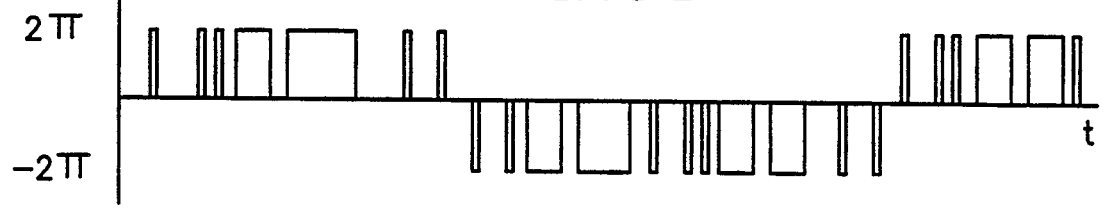
Figure 3G:
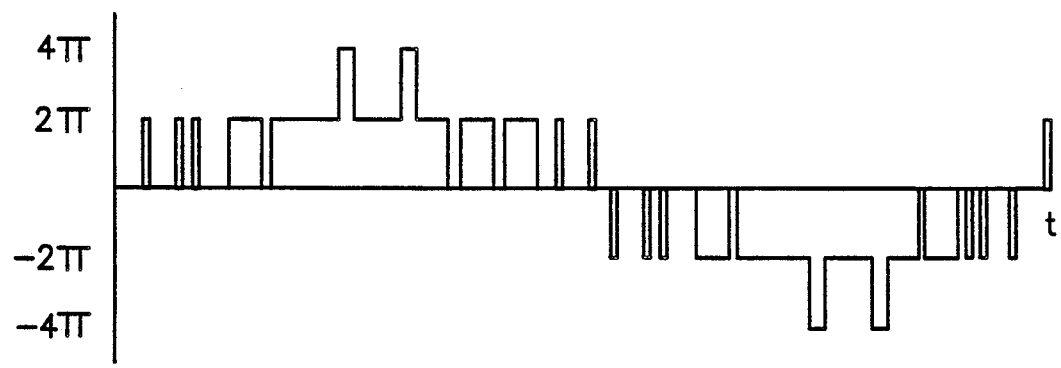

In FIG. 3E, the effect of the second accumulator on the divisor of the loop divider 16 are demonstrated for the example modulating waveform in FIG. 3A. In FIG.

3F, the effect of the divisor on the phase adjustments in the loop from steady state is illustrated. As with FIG. 3D the waveform of FIG. 3F can be regarded as an input summed at the divider input (15').

Figure 3H:
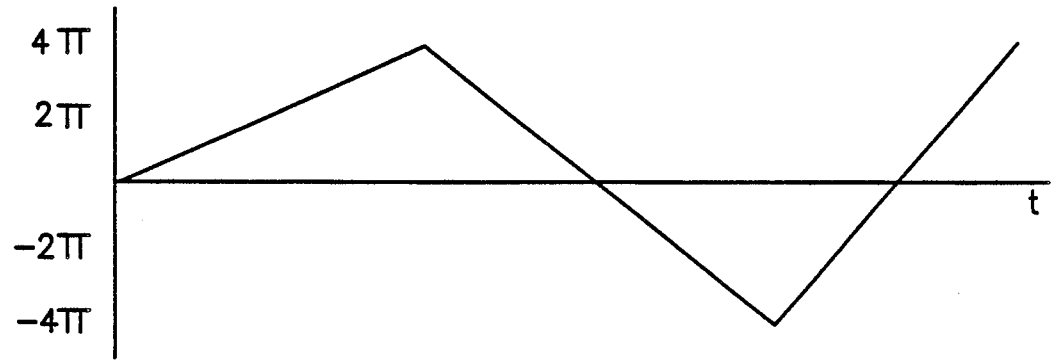
Figure 3I:
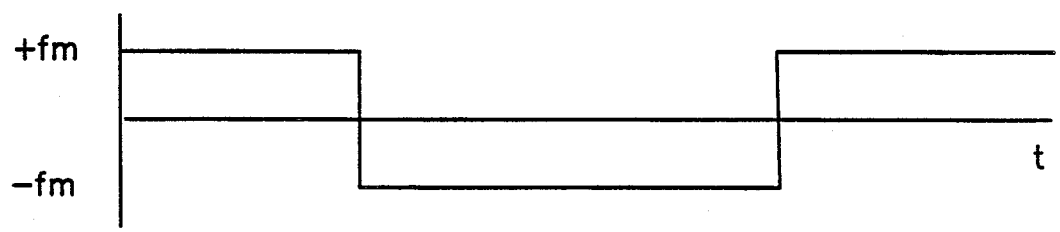

In the invention, the actions of the two accumulators are combined ad the sum of the two actions is applied to the loop divider. The total phase adjustments to the loop for this operation are demonstrated for the example modulating signal of FIG. 3A in FIG. 3G. The low pass action of the loop filters out the high frequency disturbances of the waveform produced by the varying divider such that the remaining phase adjustments to the loop measured at the VCO track the phase adjustments required to produce a low distortion FM representation of the modulating signal. This is illustrated in FIG. 3H for the modulating waveform of FIG. 3A. The deviation of the FM signal at the VCO output is illustrated in FIG. 3i.

Figure 4:
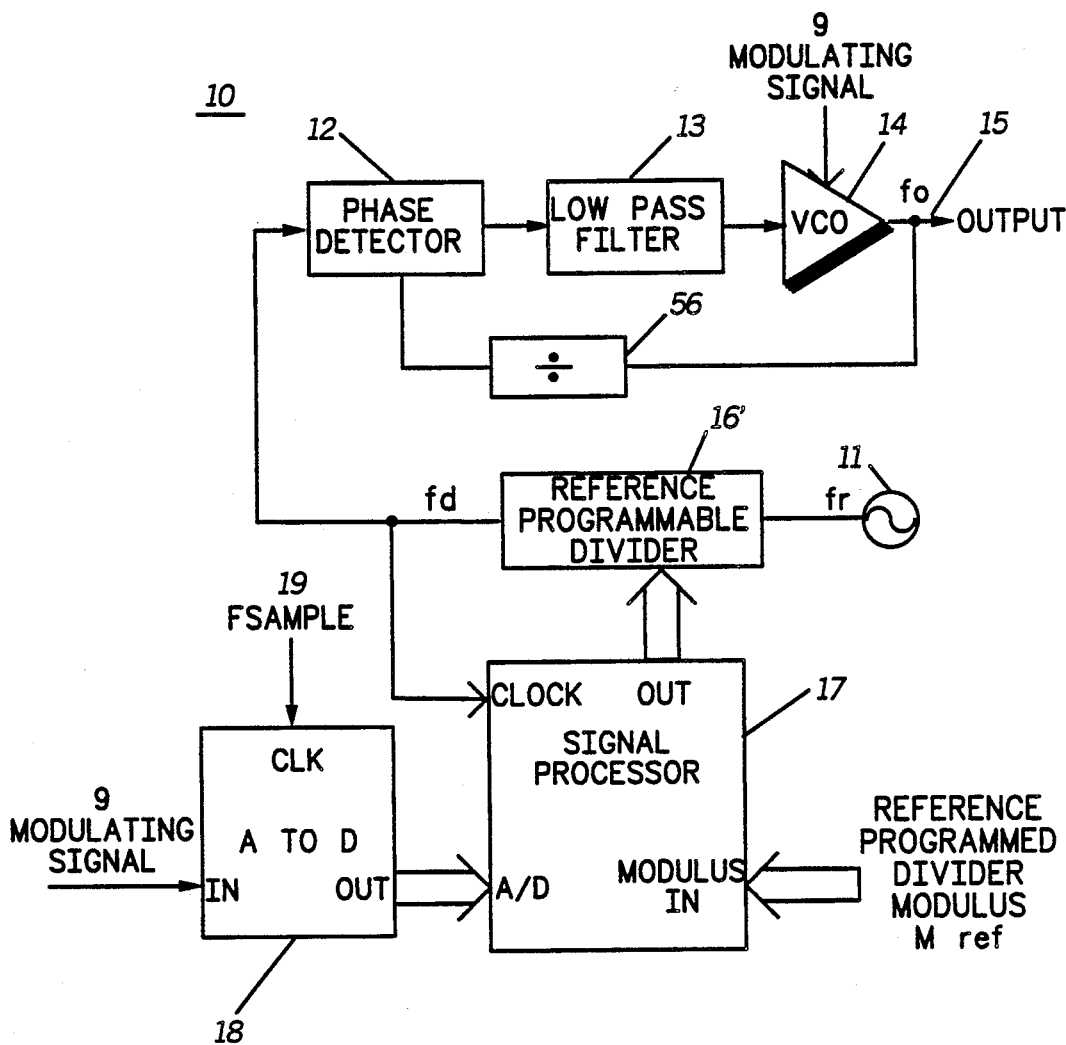
FIG. 4 is a block diagram of an alternate embodiment of a frequency synthesizer with FM modulation in accordance with the present invention.

Referring to FIG. 4, an alternate embodiment of the present invention is illustrated. The digital technique for linear modulation of the present invention is applied to a reference programmable divider 16' instead of a loop divider 56 which maintains the same divider modulus code M. The reference programmable divider 16', having the divisor $M_{ref}$ is coupled in between the reference frequency oscillator 11 and the phase detector 12. Similarly to the preferred embodiment of FIG. 1, the signal processor 17 processes the reference programmed divider modulus $M_{ref}$ and the digitized modulating signal output of the A/D converter 18 to modify $M_{ref}$ in accordance with the modulating signal 9.

Figure 5:
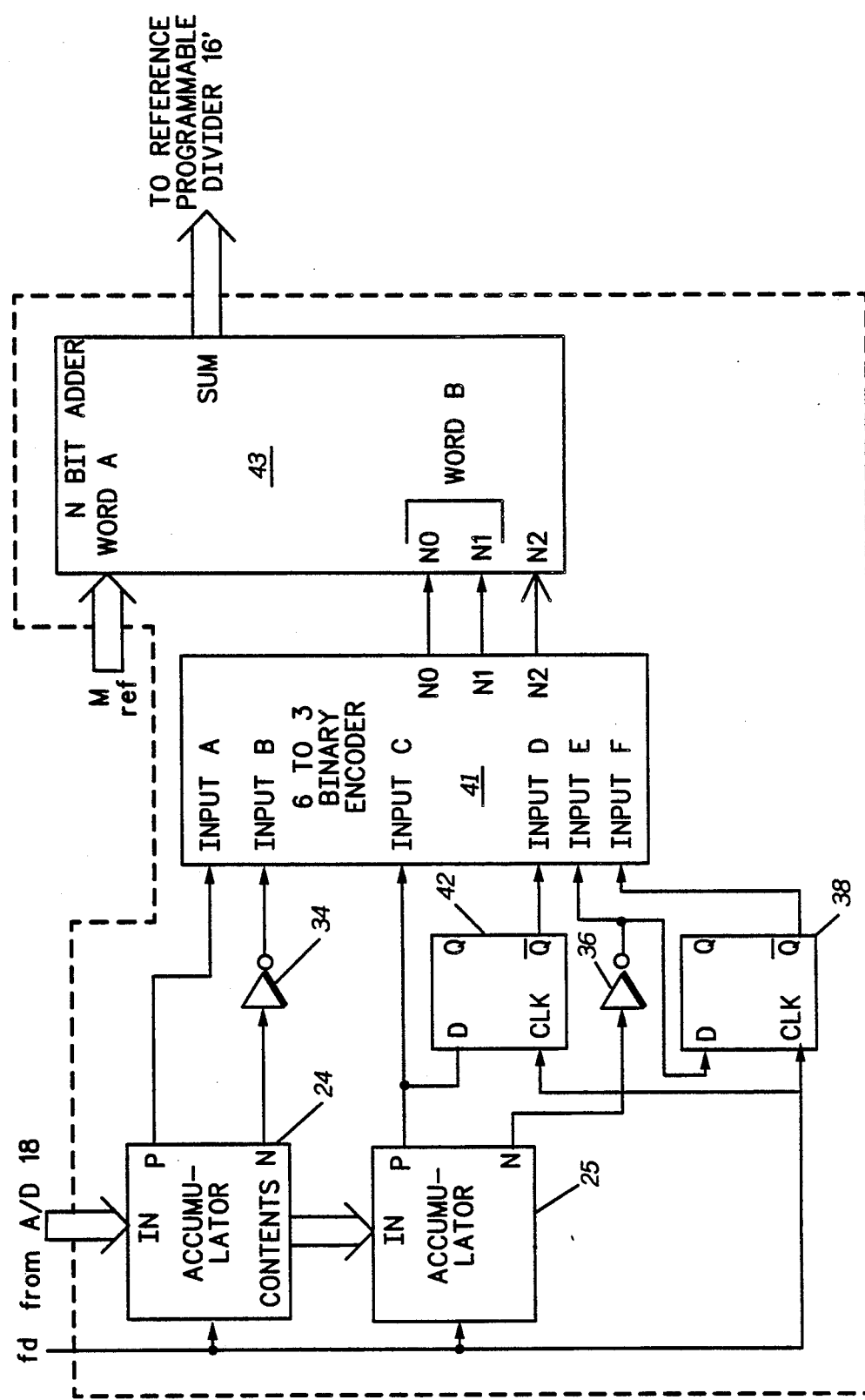
FIG. 5 is a block diagram of the signal processor of the frequency synthesizer of FIG. 4.

Referring to FIG. 5, a block diagram of the signal processor of the frequency synthesizer of FIG. 4 is illustrated. Internally, the structure of the signal processor 17 of FIG. 5 remains the same as that of FIG. 2. Only the originations and destination for the inputs and output of the signal processor 17 are different. The signal processor 17 is now programmed by the reference programmed divider modulus $M_{ref}$ and clocked by the divided frequency fd. The output of the signal processor 17 is subsequently applied to the reference programmable divider 16' in accordance with the rest of the present invention already described.

The invention has been described at it would be implemented using two accumulators. Other schemes could be used for improved reduction of distortion such as adding additional accumulators or using other more sophisticated algorithms.

I claim as my invention:

1. A frequency synthesizer for providing a modulated output signal, comprising:
    means for producing a reference frequency signal;
    a voltage controlled oscillator;
    programmable dividing means coupled to the output of the voltage controlled oscillator for dividing the frequency of the output signal from the voltage controlled oscillator by a divisor;
    phase detector means having a first input coupled to said means for producing a reference frequency signal, a second input coupled to the output of said programmable dividing means, and an output coupled to the input of the voltage controlled oscillator to produce a phase-locked loop in which the frequency of the output signal from the voltage controlled oscillator is equal to the frequency of the reference frequency signal multiplied by said divisor;
    first integrating means for integrating a modulating signal to provide an integrated signal and a first control signal;
    second integrating means coupled to said first integrating means for integrating said integrated signal to provide a second control signal;
    differentiating means coupled to said second integrating means for differentiating said second control signal to provide a third control signal; and
    processing means coupled to said first integrating means, said second integrating means, and said differentiating means for processing said first, second, and third control signals and a divider modulus code, said processing means modifying said divider modulus code in response to said modulating signal and being coupled to said programmable dividing means to provide said divisor, whereby the frequency of the output signal from the voltage controlled oscillator is modulated by said modulating signal.

2. The frequency synthesizer of claim 1 wherein said processing means comprises:
    encoder means having inputs for said first, second, and third control signals;
    adder means coupled to said encoder means and having an input for said divider modulus code; and
    analog-to-digital conversion means being coupled to said first integrating means for digitizing an input modulating signal, said processing means modifying said divider modulus code in response to said input modulating signal.

3. The frequency synthesizer of claim 1 wherein said means for integrating comprise summing means.

4. The frequency synthesizer of claim 1 wherein said means for integrating comprise summing means.

5. The frequency synthesizer of claim 1 wherein said first, second, and third control signal each consists of a first output and a second output.

6. The frequency synthesizer of claim 1 wherein said first integrating means comprises:
    a first carry output and a second carry output to provide said first control signal for varying said divider modulus code, said first integrating means being operable to cumulatively add said modulating signal to a content therein to provide a first cumulative sum to generate said first control signal; and
    a third output for providing said integrated signal to said second integrating means.

7. The frequency synthesizer of claim 6 wherein said second integrating means comprises:
    an input connected to said third output of said second integrating means; and
    a first carry output and a second carry output to provide said second control signal for varying said divider modulus code, said second integrating means being operable to cumulatively add said integrated signal to a content therein to provide a second cumulative sum to generate said second control signal.

8. The frequency synthesizer of claim 7 wherein said differentiating means comprises a first delaying and inverting means coupled to said first carry output of said second control signal to provide a first inverted output of said third control signal and a second delaying and inverting means coupled to said second carry output of said second control signal to provide a second inverted output of said third control signal.

9. The frequency synthesizer of claim 8 wherein said first delaying and inverting means comprises a first flip-flop.

10. The frequency synthesizer of claim 9 wherein said second delaying and inverting means comprises an inverter coupled to said second carry output of said second control signal and being coupled to a second flip-flop to provide said second inverted output of said third control signal.

11. The frequency synthesizer of claim 6 wherein said first carry output of said control signal increases said divider modulus code when said first cumulative sum reaches at least a predetermined positive threshold value.

12. The frequency synthesizer of claim 6 wherein said second carry output of said first control signal decreases said divider modulus code when said first cumulative sum reaches at least a predetermined negative threshold value.

13. The frequency synthesizer of claim 8 wherein said first carry output of said second control signal and said first inverted output of said third control signal increase and subsequently decrease said divider modulus code when said second cumulative sum reaches at least a predetermined positive threshold value.

14. The frequency synthesizer of claim 8 wherein said first carry output of said second control signal is coupled to said first delaying and inverting means to subsequently decrease said divider modulus code.

15. The frequency synthesizer of claim 8 wherein said second carry output of said second control signal and said second inverted output of said third control signal decrease and subsequently increase said divider modulus code when said second cumulative sum reaches at least a predetermined negative threshold value.

16. The frequency synthesizer of claim 8 wherein said second carry output of said second control signal is coupled to said second delaying and inverting means to subsequently increase said divider modulus code.

17. The frequency synthesizer of claim 10 wherein said first and second integrating means, and said first and second flip-flops are clocked at said reference frequency.

18. A method of modulating a synthesizer, comprising the steps of:
producing a reference frequency signal;
producing an output frequency signal from a voltage controlled oscillator;
dividing the frequency of the output frequency signal by a divisor in a programmable dividing means;
comparing said reference and divided output frequency signals in a phase detector means to produce a phase control signal;
controlling said voltage controlled oscillator with said phase control signal so that said output frequency signal becomes equal to said reference frequency signal multiplied by said divisor;
integrating a modulating signal in a first integrating means to provide an integrated signal and a first control signal;
integrating said integrated signal from said first integrating means in a second integrating means to provide a second control signal;
differentiating said second control signal from said second integrating means in a differentiating means to provide a third control signal; and
processing said first, second, and third control signals and a divider modulus code in a processing means coupled to said first integrating means, said second integrating means and said differentiating means, said processing means modifying said divider modulus code in response to said modulating signal and being coupled to said programmable dividing means to provide said divisor, whereby the frequency of the output signal from the voltage controlled oscillator is modulated by said modulating signal.

19. A frequency synthesizer in a radio for providing a modulated output signal comprising:
a voltage controlled oscillator;
means for producing a frequency signal;
programmable dividing means coupled to the output of the voltage controlled oscillator for dividing the frequency of the output signal from the voltage controlled oscillator by a divisor;
phase detector means having a first input coupled to said means for producing a reference frequency signal, a second input coupled to the output of said programmable dividing means, and an output coupled to the input of the voltage controlled oscillator to produce a phase-locked loop in which the frequency of the output signal from the voltage controlled oscillator is equal to the frequency of the reference frequency signal multiplied by said divisor;
signal converting means for receiving a modulation signal and for converting said modulation signal to digital signals;
a cascaded plurality of integrating means for processing said digital signals to induce a plurality of phase adjustments into said phase-locked loop to track said modulation signal;
divisor means coupled to said programmable dividing means and to said cascaded plurality of integrating means to modify a divider modulus code in response to said digital signals converted by said signal converting means and processed by said plurality of integrating means to provide said divisor, whereby the frequency of the output signal from the voltage controlled oscillator is modulated by said modulation signal.

20. A frequency synthesizer in a radio for providing a modulated output signal, comprising:
phase-locked loop including means for producing a reference frequency signal, a phase detector, a voltage controlled oscillator, and programmable dividing means operatively connected to apply a divisor to the output of one of said voltage controlled oscillator and said means for producing a reference frequency signal;
first integrating means for integrating a modulating signal to provide an integrated signal and a first control signal;
second integrating means coupled to said first integrating means for integrating said integrated signal to provide a second control signal;
differentiating means coupled to said second integrating means for differentiating said second control signal to provide a third control signal; and
processing means coupled to said first integrating means, said second integrating means, and said differentiating means for processing said first, second, and third control signals and a divider modulus code, said processing means modifying said divider modulus code in response to said modulating signal and being coupled to said programmable dividing means to provide said divisor, whereby the frequency of the output signal from the voltage controlled oscillator is modulated by said modulating signal.

21. The frequency synthesizer of claim 20 wherein said programmable dividing means is interposed between said means for producing a reference frequency signal and said phase detector for dividing the frequency of the reference frequency by said divisor, whereby the reference frequency signal is modulated by said modulating signal.

22. The frequency synthesizer of claim 20 wherein said programmable dividing means is interposed between said voltage controlled oscillator and said phase detector for dividing the frequency of the output signal from said voltage oscillator by said divisor.

* * * * *

UNITED STATES PATENT AND TRADEMARK OFFICE
CERTIFICATE OF CORRECTION

PATENT NO. : 4,994,768

DATED : February 19, 1991

INVENTOR(S) : Wayne P. Shepherd, et al

It is certified that error appears in the above-identified patent and that said Letters Patent is hereby corrected as shown below:

Claim No. 3
Column 6, line 33, delete "summing" and insert -- accumulator --.

Claim No. 20
Column 8, line 46, at the beginning of the line, before "phase-locked" insert -- a --.

Signed and Sealed this

Twentieth Day of October, 1992

Attest:

DOUGLAS B. COMER

Attesting Officer

Acting Commissioner of Patents and Trademarks